Figure 1:
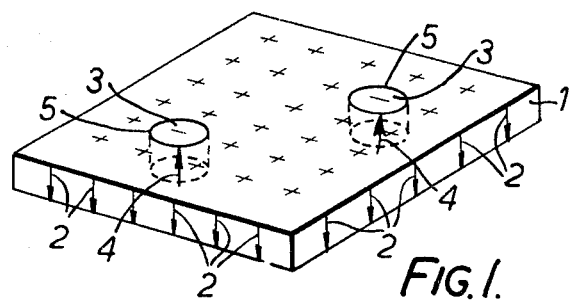

United States Patent [19]

Fairholme

[11] 4,052,708

[45] Oct. 4, 1977

[54] CIRCULAR MAGNETIC DOMAIN DEVICES

[75] Inventor: Russel John Fairholme, Daventry, England

[73] Assignee: Plessey Handel und Investments A.G., Zug, Switzerland

[21] Appl. No.: 572,875

[22] Filed: Apr. 29, 1975

[30] Foreign Application Priority Data

May 2, 1974 United Kingdom .............. 19205/74

[51] Int. Cl.² ............................................. G11C 19/08
[52] U.S. Cl. ............................................. 340/174 TF
[58] Field of Search .................................. 340/174 TF

[56] References Cited

U.S. PATENT DOCUMENTS

| 3,723,716 | 3/1973 | Bobeck et al. | 340/174 TF |
| 3,797,001 | 3/1974 | Chen et al. | 340/174 TF |
| 3,810,133 | 5/1974 | Bobeck et al. | 340/174 TF |
| 3,876,995 | 4/1975 | Clover et al. | 340/174 TF |

Primary Examiner—James W. Moffitt

Attorney, Agent, or Firm—Fleit & Jacobson

[57] ABSTRACT

A cylindrical magnetic domain device which includes a layer of uniaxial magnetic material having a unique easy magnetization direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of the said propagation paths to at least another one of the said propagation paths, the switching means including at least three magnetically permeable elements formed on the said major surface and oriented relative to each other and the propagation paths in a manner such that expansion of the propagating cylindrical magnetic domains can be effected; and magnetic field impulse generating means positioned to encompass at least the central element of the switching means.

14 Claims, 5 Drawing Figures

CIRCULAR MAGNETIC DOMAIN DEVICES

The invention relates to circular magnetic domain devices.

Known circular magnetic domain devices include a thin layer of uniaxial magnetic material, for example, orthoferrite, which possesses an easy axis for a magnetic vector that is directed normal to the thin magnetic layer. It is possible for the thin magnetic layer to possess a positive magnetic vector at all points except for a few small cylindrical regions, called magnetic domains or magnetic bubbles, within which the magnetic vector is negative. It should be noted that the polarities positive and negative are only arbitrarily assigned. The cylindrical internal surface forming the boundary between each of the magnetic domains and the remainder of the magnetic material of the thin layer are termed domain walls or, more explicitly, 180° Bloch walls. The magnetic domains or bubbles are nucleated and made to propagate within the thin magnetic layer in a manner which is described by A. H. Bobeck et al in the I.E.E.E. Transactions on Magnetics, Volume MAG. 5, No. September, 3, 1969 at pages 544 to 565.

Magnetic shift registers and magnetic serial information stores can be based on circular magnetic domains since these domains have the important properties that they are permanent and maintain a consistent size and that they possess high lateral mobility across the thin layer of magnetic material, and they can, therefore, move at high speeds when subjected to a magnetic field gradient. The binary value "1" can be assigned to the presence of a cylindrical magnetic domain at a certain position and time, and the binary value "O" can be assigned to the absence of a cylindrical magnetic domain at that certain position and time. Under these conditions the flow of binary information across the thin magnetic layer will correspond to the linear flow of a binary pattern of cylindrical magnetic domains across the layer. The binary information can be processed in a variety of magnetic ways and ultimately the binary information is converted by a read-out arrangement into electrical impulses which are utilised for a variety of purposes, for example, for the transmitting of the binary information over distances too great to be spanned by the thin magnetic layer.

When it is required to organise a number of shift registers that are based on magnetic cylindrical domains into a cylindrical magnetic domain device which can perform a serial data storage function or more generally a data switching function, it is necessary to be able to effect the transfer of the flow of a binary pattern of cylindrical magnetic domains from one propagation path to another propagation path.

The invention provides a cylindrical magnetic domain device which includes a layer of uniaxial magnetic material having a unique easy magnetisation direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of the said propagation paths to at least another one of the said propagation paths, the switching means including at least three magnetically permeable elements formed on the said major surface and orientated relative to each other and the propagation paths in a manner such that expansion of the propagating cylindrical magnetic domains can be effected, and magnetic field impulse generating means positioned to encompass at least the central element or elements of the switching means.

Figure 2:
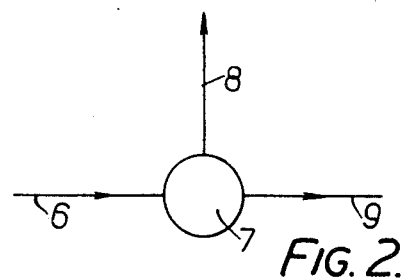
Figure 3:
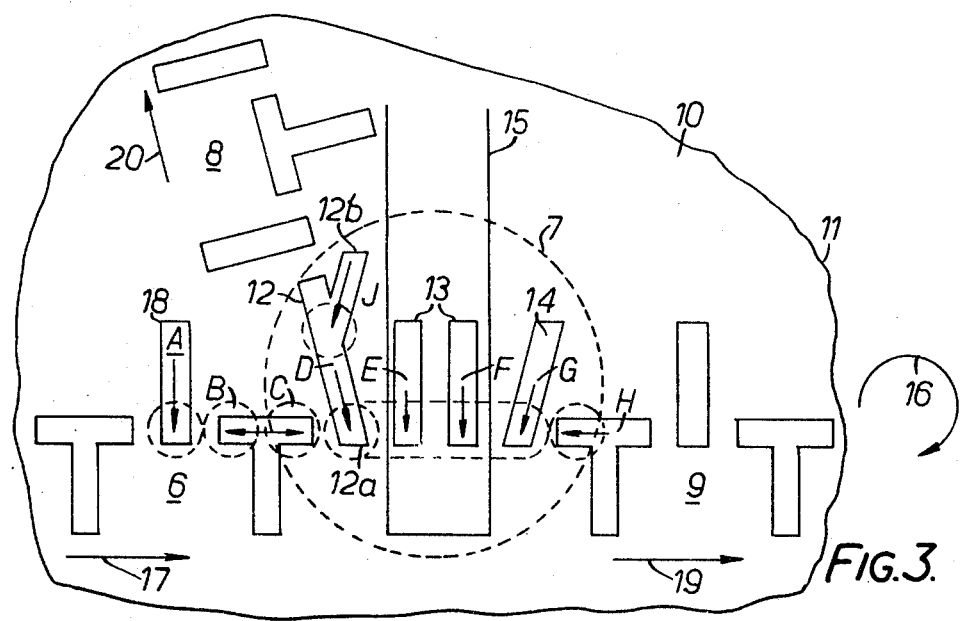
Figure 4:
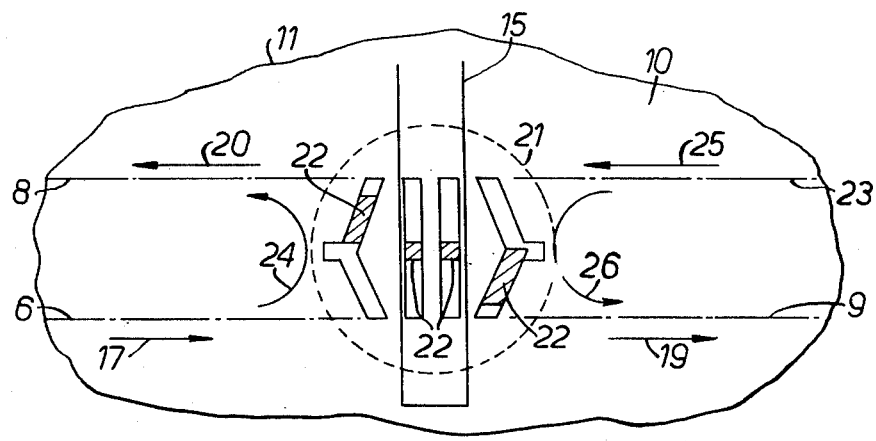
Figure 5:
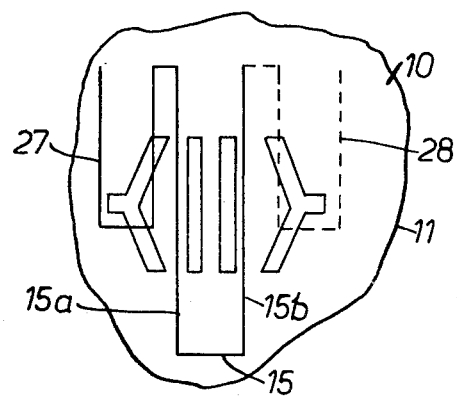

The foregoing and other features according to the invention will be better understood from the following description with reference to the accompanying drawings, in which:

FIG. 1 diagrammatically illustrates the basic principles of a cylindrical magnetic domain device, FIG. 2 diagrammatically illustrates a switching arrangement for a cylindrical magnetic domain device according to the invention, FIG. 3 diagrammatically illustrates, in a plan view a practical circuit configuration for the switching arrangement of FIG. 2, FIG. 4 diagrammatically illustrates in a plan view another switching arrangement for a cylindrical magnetic domain device according to the invention, and FIG. 5 diagrammatically illustrates in a plan view, alternative configurations for the switching arrangement of FIG. 4.

Referring to FIG. 1 of the drawings, which illustrates the basic principles of a cylindrical magnetic domain device, a thin layer 1 of uniaxial magnetic material, for example orthoferrite, is illustrated, which possesses an easy axis for a magnetic vector directed normal to the layer. It is possible, as previously stated, for the magnetic layer 1 to possess a positive magnetic vector 2 at all points except for a few small cylindrical regions 3, called magnetic domains, within which the magnetic vector 4 is negative. The cylindrical internal surface 5 forming the boundary between the domains 3 and the remainder of the material of the layer 1 forms a domain wall, or, more explicitly, a 180° Bloch wall. As previously stated, the polarities positive and negative are arbitrarily assigned and should, therefore, not be considered as a limitation.

The magnetic domains can, as is described in detail in the previously cited I.E.E.E. Transactions, be caused to propagate within the magnetic layer 1 of FIG. 1 by the use of a permeable circuit that is constituted by a pattern of soft magnetic material, for example, isotropic Permalloy, which is formed on a major surface of the magnetic layer 1 and which defines a propagation path for the magnetic domains. This pattern is called a T-BAR overlay pattern because of the arrangement of the magnetic bars which form the pattern. The manner in which propagation is effected is described in the cited I.E.E.E. Transactions, and it will, therefore, not be described in any detail in this specification. It should, however, be noted that the cylindrical magnetic domain device according to the present invention is not limited to the use of a T-BAR overlay to effect propagation, this pattern configuration is given by way of example only and other pattern configurations and propagation methods are possible which, will be evident and/or known to a person skilled in this particular art.

In general, the principle of propagation by means of a travelling wave in a permeable circuit can be regarded as being based on the attraction of the individual magnetic domains to a magnetic pole concentrated (of a certain sign) in the permeable circuit. The pole concentrations can, in response to a variation of an applied magnetic field, for example an applied rotating field, by made to either move smoothly or re-appear at discreet intervals along a propagation path of the permeable circuit.

The generation of the magnetic domains can, as is described in detail in the previously cited I.E.E.E. Transactions, be effected either by the use of conducting loops or by the use of a pattern of soft magnetic material, for example, isotropic Permalloy, which is formed on a major surface of the layer 1, at that position, i.e. adjacent to the start of the propagation path defined by, for example, the T-BAR overlay, where magnetic domain generation is to be effected. The latter magnetic domain generation method utilises, at the generation position, a disc of the soft magnetic material that is formed on the layer 1 and has a permanent magnetic domain associated with it which stays in contact with a positive pole formed on the disc by a rotating transverse magnetic field. As the magnetic field associated with the disc rotates, the discs' domain also rotates and at some point during rotation attaches itself to the propagation paths magnetic pattern. As the magnetic field continues rotation after the magnetic domain has become attached to the propagating paths magnetic pattern, the magnetic domain is stretched until it ruptures into two portions. One of the portions remains on the disc and can be used to generate further domains whilst the other portion remains in the propagation path. Both portions then return to a magnetic domain size which is determined by the bias field.

The magnetic domains can be utilised to effect a serial data storage function or data switching function if facilities exist whereby a binary pattern of cylindrical magnetic domains propagating in a path 6 (See FIG. 2) can be transferred by means of a switching arrangement 7 either to a path 8, or a path 9 or to both the paths 8 and 9. This transfer facility can be effected by the switching arrangement which forms part of a cylindrical magnetic domain device according to the present invention, and which is diagrammatically illustrated in a plan view in FIG. 3 of the drawings.

Referring to FIG. 3 of the drawings, the propagation paths 6, 8 and 9, of FIG. 2 are each represented by a known magnetically permeable T-BAR configuration formed on a major surface 10 of a uniaxial magnetic layer 11 and the switching arrangement 7 includes a conductor loop 15 and a number of magnetically permeable elements 12, 13 and 14 formed on the major surface 10 and orientated relative to each other and the paths 6, 8 and 9 in a manner such that the circular magnetic domains propagating in the path 6 can be expanded across the elements 12 to 14 in a manner to be subsequently outlined.

In operation a rotating magnetic field is applied to the layer 11 and the direction of rotation of this magnetic field is indicated by an arrow 16 in FIG. 3. The cylindrical magnetic domains which are indicated in dotted detail in FIG. 3, are attracted and thereby caused to propagate by magnetic pole concentrations induced in the magnetically permeable elements of FIG. 3 by the rotating magnetic field 16. The heads of the arrows illustrated in FIG. 3 which are labelled in the sequence A to H, correspond to the positions of magnetic pole concentrations in the respective elements in response to the applied rotating magnetic field 16. The instantaneous orientation of the rotating magnetic field is indicated by the direction of the arrow A to H. Thus, cylindrical magnetic domains propagating in the path 6, in the direction of the arrow 17 will on reaching the element 18 of the T-BAR configuration of this path, i.e. stage A, be propagated through stages B to G as the magnetic pole concentration attracting each domain is moved through the various stages by the applied rotating magnetic field. When stage D is reached the orientation of the elements 12 to 14 relative to each other is such that these elements expand the domain as the magnetic field rotates through stages D to G with the inclined limb 12a of the three limbed leading element 12 becoming more attractive to the domain just before the other elements whilst the trailing limb 14 which is also inclined and forms part of the path 9, becomes more attractive just after the expansion. The three limbed leading element 12 forms part of the propagation path 8 as well as the route between propagation paths 6 and 8.

In one mode of operation, no current pulses are applied to the conductor loop 15, and the domains, after being expanded across the stages D to G, are allowed to contract at Stage H as the field rotates and then to continue propagating along path 9 in the direction of the arrow 19.

In another mode of operation, a current pulse is applied to the conductor loop 15 when each of the propagating domains is in an expanded state and the polarity, amplitude and width of the current pulse is arranged so that the resulting magnetic field impulse causes that part of the expanded domain within the loop 15 to collapse and thereby produce two cylindrical magnetic domains. This mode of operation can, for example, be effected using a 1 $\mu$sec wide pulse having an amplitude of 60 mamp when T-bar configuration are used for the propagation paths and the rotating magnetic field has a frequency of 100KHz. One of the two domains that are produced will be caused to propagate along the path 9 in the direction of the arrow 19 as the field rotates while the other one of the domains will be caused to propagate along the path 8 in the direction of the arrow 20. The cylindrical magnetic domains propagating along the path 6 will therefore, with this mode of operation by replicated in the propagation paths 8 and 9.

In another mode of operation, a current pulse is applied to the conductor loop 15 before a cylindrical magnetic domain expands onto elements 13 and 14, the polarity amplitude and width of the current pulse being arranged so that the resulting magnetic impulse prevents expansion of the domain across the elements 12 to 14. The domains on reaching stage D, are, therefore, caused to propagate along the limb 12a of the element 12 by the attraction of the magnetic pole concentration at a stage J i.e. the junction of the limb 12a and another limb 12b of the element 12. The domain will then be caused to propagate along the path 8 in the direction of the arrow 20 as the field rotates. This mode of operation can, for example, be effected using a 3$\mu$sec wide pulse having an amplitude of 40 mamp when T-bar configurations are used for the propagation paths and the rotating magnetic field has a frequency of 100KHz.

In a further mode of operation any one, or all, of the domains propagating in the path 6 can be annihilated in a known manner by applying a current pulse of the required polarity, amplitude and width to the conductor loop 15 at the appropriate instant.

It should be noted that whilst it is preferable to have two elements 13 in the switching arrangement 7 of FIG. 3, the arrangement would function in the specified manner with only one or even three of these elements.

In order to provide a switching arrangement capable of switching and replicating two cylindrical magnetic domain trains it is necessary, as is illustrated in FIG. 4 of the drawings, to combine two of the switching arrangement 7 of FIG. 3 to provide a further switching arrangement 21 with a single conductor loop 15. The combined structure is achieved by rotating one of the switching arrangements 7 through 180° relative to the other one and eliminating the redundant regions i.e. the cross-hatched areas 22, caused by the overlaps. The propagation paths, 6, 8, and 9 of FIG. 3 are represented by chain dotted lines in FIG. 4 and the domains propagating in the path 6 can be caused, in the manner outlined in preceding paragraphs, to propagate either in path 9 or both of the paths 8 and 9, the direction of propagation from path 6 to path 8 through the switching arrangement 21 being indicated in FIG. 4 by an arrow 24.

A fourth propagation path which is represented by a chain dotted line 23 and which, like the paths 6, 8 and 9, could be represented by a T-BAR configuration, can be used to enable a cylindrical magnetic domain train propagating therealong in the direction of an arrow 25 to be transferred to either path 8, path 9 or both of the paths 8 and 9, the direction of propagation from path 23 to path 9 through the switching arrangement 21 being indicated by an arrow 26. With this arrangement, the behaviour of the cylindrical magnetic domains propagating in the path 23 is identical with that described in preceding paragraphs for the cylindrical magnetic domains propagating in the path 6 except that the phases of the current pulses used to effect the switching and replicating functions, are, from symmetry considerations shifted by 180°.

In order to increase the attractive force on the replicated cylindrical magnetic domains, the shape of the conductor loop 15, can, as is illustrated in FIG. 5 of the drawings, be modified by adding an additional loop 27 or a portion of the additional loop 27 to the limb 15a of the loop 15 or by adding an additional loop 28 or a portion of the additional loop 28 (shown in dotted detail) to the limb 15b of the loop 15.

It is understood that the foregoing description of specific examples of this invention is made by way of example only and is not to be considered as a limitation in its scope.

What is claimed is:

1. A cylindrical magnetic domain device which includes a layer of uniaxial magnetic material having a unique easy magnetization direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of the said propagation paths to at least another one of the said propagation paths, the switching means including at least three magnetically permeable elements formed on the said major surface and orientated relative to each other and the propagation paths in a manner such that expansion of the propagating cylindrical magnetic domains in the direction of domain propagation can be effected, and magnetic field impulse generating means positioned to encompass at least the central element or elements of the switching means for generating a current pulse of the desired polarity, amplitude and width for modifying the characteristics of the propagating domain.

2. A cylindrical magnetic domain device as claimed in claim 1 wherein the propagation means define three propagation paths and wherein a first one of the said magnetically permeable elements forms part of the said one of the propagation paths and the route between the said one of the propagation paths and another one of the propagation paths.

3. A cylindrical magnetic domain as claimed in claim 1 wherein the impulse generating means includes a conductor shaped in the form of at least one loop which encompasses the central element or elements of the switching means.

4. A cylindrical magnetic domain device as claimed in claim 3 wherein the shape of the conductor is such that it includes at least part of another loop which is positioned over an outer element of the switching means.

5. A cylindrical magnetic domain device as claimed in claim 3 wherein the impulse generating means also includes magnetic domain annihilation means adapted to cause a current pulse to be applied to the looped conductor for effecting the annihilation of a propagating domain.

6. A cylindrical magnetic domain device includes a layer of uniaxial magnetic material having a unique easy magnetisation direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of said propagation paths to at least another one of the said propagation paths, the switching means including at least three magnetically permeable elements formed on the said major surface and orientated relative to each other and the propagation paths in a manner such that expansion of the propagating cylindrical magnetic domains can be effected, and magnetic field impulse generating means positioned to encompass at least the central element or elements of the switching means; wherein the propagation means define three propagation paths; wherein a first one of the said magnetically permeable elements forms part of the said one of the propagation paths and the route between the said one of the propagation paths and another one of the propagation parts; and wherein a second one of the said magnetically permeable elements forms part of the other one of the propagation paths and is inclined at an angle relative to the other magnetically permeable elements, the angle of inclination being such that the second one of the magnetically permeable elements becomes more attractive to the propagating domain than the other magnetically permeable elements just after expansion of the domain.

7. A cylindrical magnetic domain device as claimed in claim 6 wherein the first one of the magnetically permeable elements is a three limbed element, wherein two of the limbs are in alignment and inclined at an angle relative to the other magnetically permeable elements, the angle of inclination being such that the aligned limbs become more attractive to the propagating domain just before the other magnetically permeable elements and wherein the other one of the limbs is substantially parallel to the secondary one of the magnetically permeable elements.

8. A cylindrical magnetic domain device includes a layer of uniaxial magnetic material having a unique easy magnetisation direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of the said propagation paths to at least another one of the said propagation paths, the switching means including at least three magnetically permeable elements formed on the said major surface and orientated relative to each other and the propagation paths in a manner such that expansion of the propagating cylindrical magnetic domains can be effected, and magnetic field impulse generating means positioned to encompass at least the central element or elements of the switching means; and wherein the propagation means define four propagation paths, wherein the switching means are adapted to effect the switching and replication of two trains of cylindrical magnetic domains and wherein each of the domain trains is propagated along a separate one of first and second one of the propagation paths and is transferable by the switching means to at least one of third and fourth ones of the propagation paths.

9. A cylindrical magnetic domain device as claimed in claim 8 wherein a first one of the said magnetically permeable elements forms part of the first propagation path and the route between the first and third propagation paths and wherein a second one of the said magnetically permeable elements forms part of the second propagation path and the route between the second and fourth propagation paths.

10. A cylindrical magnetic domain device as claimed in claim 9 wherein the said first and second ones of the magnetically permeable elements are each Y-shaped, wherein the other magnetically permeable element or elements of the switching means is or are located between the first and second elements and wherein the orientation of the first and second elements is such that the free ends of inclined limbs of the Y-shape of the first element are opposite the free ends of the inclined limbs of the Y-shape of the second element.

11. A cylindrical magnetic domain device includes a layer of uniaxial magnetic material having a unique easy magnetisation direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of the said propagation paths to at least another one of the said propagation paths, the switching means including at least three magnetically permeable elements formed on the said major surface and orientated relative to each other and the propagation paths in a manner such that expansion of the propagating cylindrical magnetic domains can be effected, and magnetic field impulse generating means positioned to encompass at least the central element or elements of the switching means; wherein the impulse generating means includes a conductor shaped in the form of at least one loop which encompasses the central element or elements of the switching means; and wherein the impulse generating means also includes means adapted to cause a current pulse to be applied to the looped conductor when each of the propagating domains is in an expanded state, the polarity, amplitude and width of the current pulse being arranged so that the resulting magnetic field impulse causes that part of the expanded domain ecompassed by the looped conductor to collapse and to thereby produce two domains.

12. A cylindrical magnetic domain device as claimed in claim 11 wherein the impulse generating means also includes means adapted to cause a current pulse to be applied to the looped conductor before a propagating domain is expanded, the polarity, amplitude and width of the current pulse being arranged so that the resulting magnetic field impulse prevents expansion of the domain; and magnetic domain annihilation means adapted to cause a current pulse to be applied to the looped conductor for effecting the annihiltion of a propagating domain.

13. A cylindrical magnetic domain device as claimed in claim 12 wherein the shape of the conductor is such that it includes at least part of another loop which is positioned over an outer element of the switching means.

14. A cylindrical magnetic domain device includes a layer of uniaxial magnetic material having a unique easy magnetisation direction substantially normal to a major surface thereof; generating means for generating cylindrical magnetic domains within the said layer; propagation means which define at least three propagation paths in which the generated cylindrical magnetic domains can be caused to propagate; and switching means for effecting the transfer of the propagating cylindrical magnetic domains from one of the said propagation paths to at least another one of the said propagation paths, the switching means including at least three magnetically permeable elements formed on the said major surface and orientated relative to each other and the propagation paths in a manner such that expansion of the propagating cylindrical magnetic domains can be effected, and magnetic field impulse generating means positioned to encompass at least the central element or elements of the switching means; wherein the impulse generating means includes a conductor shaped in the form of at least one loop which encompasses the central element or elements of the switching means; and wherein the impulse generating means also includes means adapted to cause a current pulse to be applied to the looped conductor before a propagating domain is expanded, the polarity, amplitude and width of the current pulse being arranged so that the resulting magnetic field impulse prevents expansion of the domain.

* * * * *